(12) United States Patent
Omstead

(10) Patent No.: US 11,031,247 B2
(45) Date of Patent: Jun. 8, 2021

(54) METHOD AND APPARATUS FOR DEPOSITING A MONOLAYER ON A THREE DIMENSIONAL STRUCTURE

(71) Applicant: Varian Semiconductor Equipment Associates, Inc., Gloucester, MA (US)

(72) Inventor: Thomas R. Omstead, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 205 days.

(21) Appl. No.: 15/899,969

(22) Filed: Feb. 20, 2018

(65) Prior Publication Data
US 2018/0182627 A1    Jun. 28, 2018

Related U.S. Application Data

(62) Division of application No. 14/324,907, filed on Jul. 7, 2014, now abandoned.

(51) Int. Cl.
*C23C 16/44*      (2006.01)
*H01L 21/225*    (2006.01)
(Continued)

(52) U.S. Cl.
CPC .... *H01L 21/2253* (2013.01); *C23C 16/45536* (2013.01); *C23C 16/45551* (2013.01); *C23C 16/486* (2013.01); *C23C 16/50* (2013.01); *C23C 16/52* (2013.01); *H01J 37/32357* (2013.01); *H01L 21/0217* (2013.01); *H01L 21/0226* (2013.01); *H01L 21/0228* (2013.01); *H01L 21/02057* (2013.01); *H01L 21/02112* (2013.01); *H01L 21/02164* (2013.01); *H01L 21/02167* (2013.01); *H01L 21/02211* (2013.01); *H01L 21/02219* (2013.01); *H01L 21/02274* (2013.01);
(Continued)

(58) Field of Classification Search
CPC . C23C 16/52; C23C 16/45536; C23C 16/486; C23C 16/45551; C23C 16/50
See application file for complete search history.

(56) References Cited

U.S. PATENT DOCUMENTS 5,693,179 A    12/1997    Blackburn et al.
6,387,207 B1    5/2002    Janakiraman et al.
(Continued)

FOREIGN PATENT DOCUMENTS

JP    2012097624 A    5/2012
KR    20070024965 A    3/2007

*Primary Examiner* — Hai Y Zhang
(74) *Attorney, Agent, or Firm* — Kacvinsky Daisak Bluni PLLC

(57) ABSTRACT

In one embodiment, a processing apparatus may include a plasma chamber configured to generate a plasma; a process chamber adjacent the plasma chamber and configured to house a substrate that defines a substrate plane; an extraction system adjacent the plasma chamber and configured to direct an ion beam from the plasma to the substrate, the ion beam forming a non-zero angle with respect to a perpendicular to the substrate plane; and a molecular chamber adjacent the process chamber, isolated from the plasma chamber and configured to deliver a molecular beam to the substrate, wherein the ion beam and molecular beam are alternately delivered to the substrate to form a monolayer comprising species from the ion beam and molecular beam.

14 Claims, 7 Drawing Sheets

(51) Int. Cl.

| | | |
|---|---|---|
| *C23C 16/455* | (2006.01) | |
| *C23C 16/48* | (2006.01) | |
| *H01L 21/02* | (2006.01) | |
| *H01L 21/311* | (2006.01) | |
| *H01J 37/32* | (2006.01) | |
| *C23C 16/50* | (2006.01) | |
| *C23C 16/52* | (2006.01) | |
| *H01L 21/324* | (2006.01) | |
| *H01L 29/66* | (2006.01) | |
| *H01L 21/22* | (2006.01) | |

(52) U.S. Cl.
CPC ...... *H01L 21/02636* (2013.01); *H01L 21/225* (2013.01); *H01L 21/2252* (2013.01); *H01L 21/31116* (2013.01); *H01L 21/324* (2013.01); *H01L 29/66803* (2013.01); *H01L 21/2225* (2013.01)

(56) References Cited

U.S. PATENT DOCUMENTS

| | | |
|---|---|---|
| 7,297,581 B1 | 11/2007 | Hill et al. |
| 8,637,411 B2 | 1/2014 | Swaminathan et al. |
| 8,674,607 B2 | 3/2014 | Iizuka |
| 2002/0046705 A1 | 4/2002 | Sandhu et al. |
| 2003/0155079 A1 | 8/2003 | Bailey, III et al. |
| 2004/0033679 A1 | 2/2004 | Jacobson et al. |
| 2004/0187784 A1 | 9/2004 | Sferlazzo |
| 2006/0068104 A1 | 3/2006 | Ishizaka |
| 2006/0208202 A1* | 9/2006 | Gupta ................ H01J 37/3171 250/492.21 |
| 2007/0000444 A1 | 1/2007 | Shimizu |
| 2007/0278576 A1 | 12/2007 | Kim et al. |
| 2008/0026162 A1 | 1/2008 | Dickey et al. |
| 2009/0294800 A1 | 12/2009 | Cheng et al. |
| 2010/0126964 A1 | 5/2010 | Smith et al. |
| 2011/0084215 A1* | 4/2011 | Hautala ............. H01L 21/26586 250/396 R |
| 2012/0207944 A1 | 8/2012 | Finch et al. |
| 2012/0222616 A1 | 9/2012 | Han et al. |
| 2012/0248328 A1 | 10/2012 | Renau et al. |
| 2013/0115763 A1 | 5/2013 | Takamure et al. |
| 2013/0196078 A1 | 8/2013 | Yudovsky et al. |
| 2013/0210238 A1 | 8/2013 | Yudovsky |
| 2013/0270655 A1 | 10/2013 | Adam et al. |
| 2013/0280876 A1 | 10/2013 | Tsai et al. |
| 2014/0004689 A1 | 1/2014 | Nainani et al. |
| 2014/0159159 A1 | 6/2014 | Steigerwald et al. |
| 2015/0087140 A1* | 3/2015 | Nozawa ............. H01L 21/02576 438/508 |

* cited by examiner

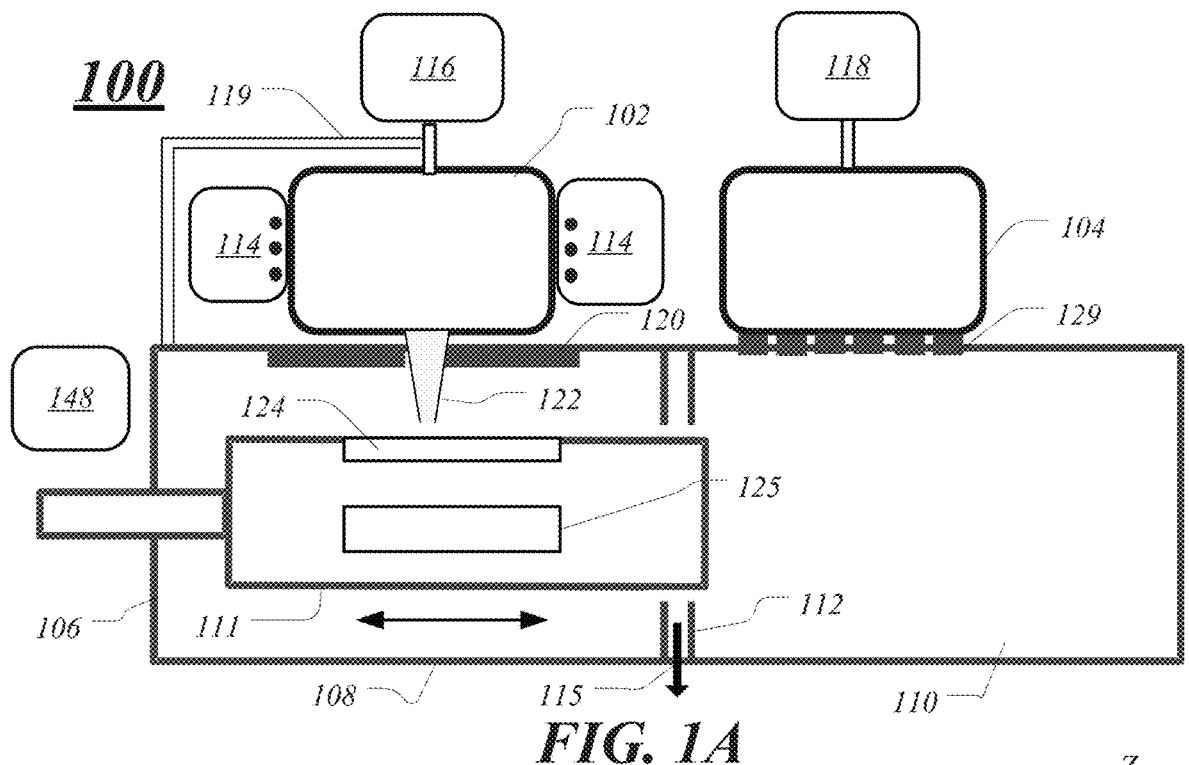
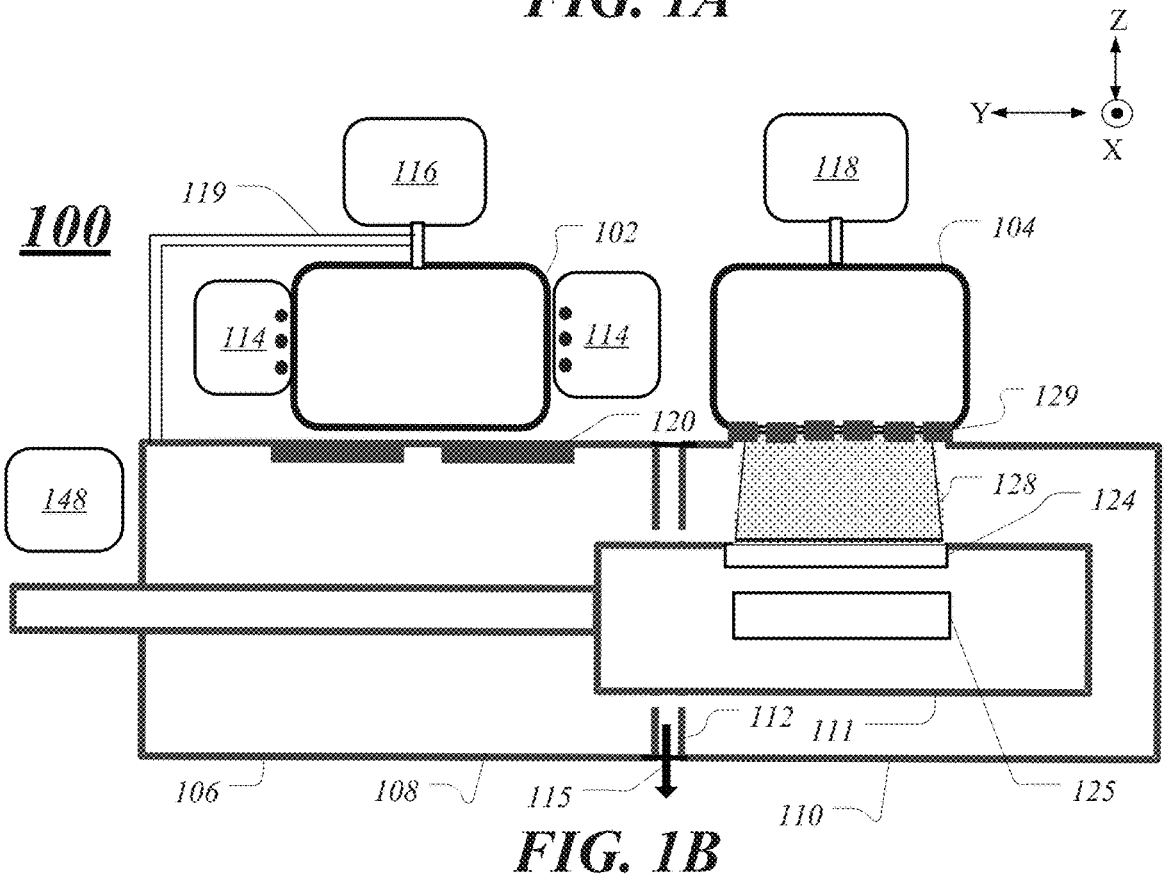
FIG. 1A
FIG. 1B

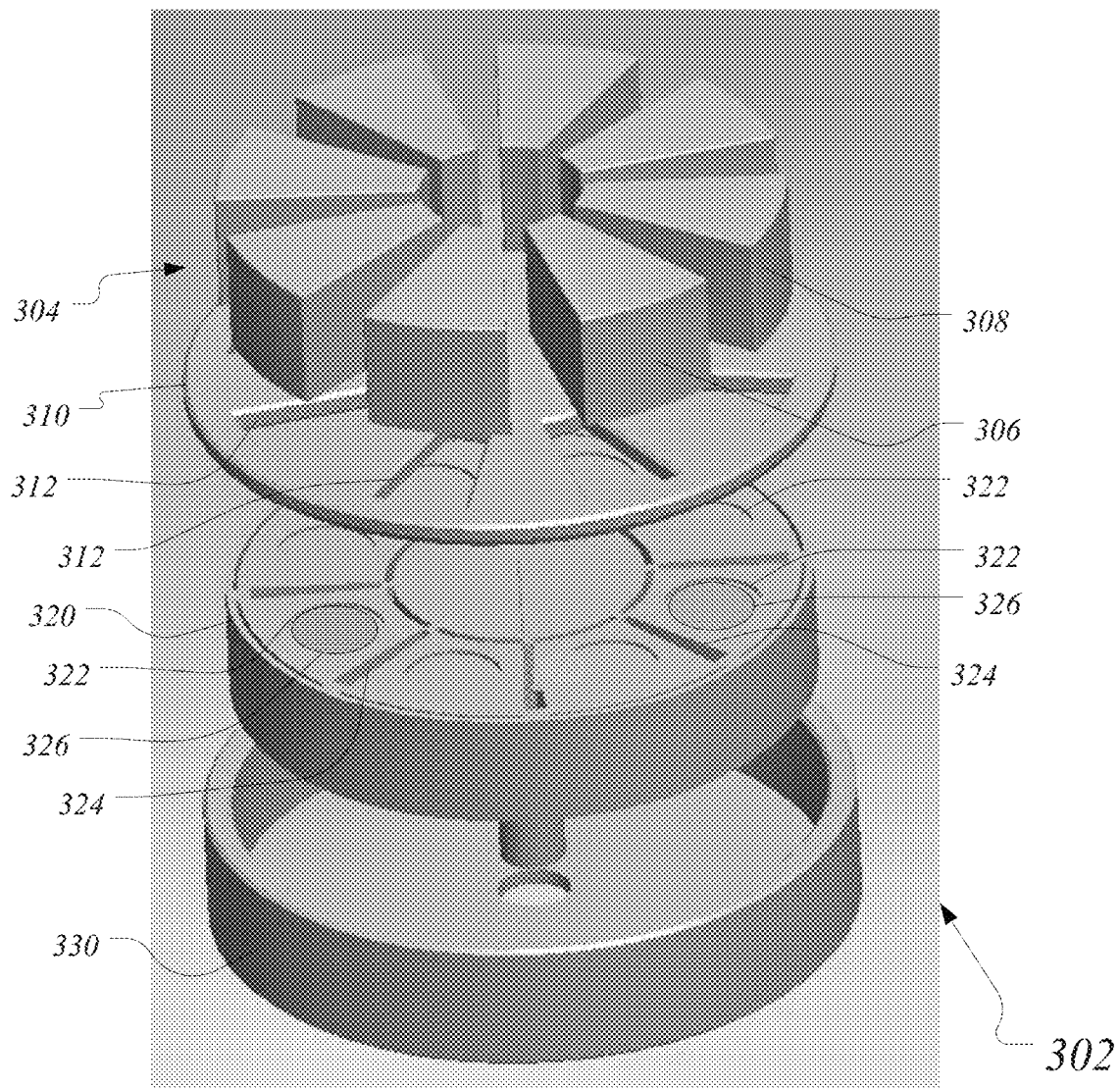
FIG. 3
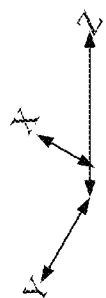

METHOD AND APPARATUS FOR DEPOSITING A MONOLAYER ON A THREE DIMENSIONAL STRUCTURE

This application is a divisional of, and claims the benefit of priority to, U.S. patent application Ser. No. 14/324,907, filed Jul. 7, 2014, entitled "Method and Apparatus for Depositing a Monolayer on a Three Dimensional Structure," which application is incorporated herein by reference in its entirety.

FIELD

The present embodiments relate to substrate processing, and more particularly, to processing apparatus and methods for depositing layers by atomic beam or molecular beam deposition.

BACKGROUND

Many devices including electronic transistors may have three dimensional shapes that are difficult to process using conventional techniques. The topology of such devices may be up-side down, re-entrant, over-hanging, or vertical with respect to a substrate plane of a substrate in which such devices are formed. In order to process such devices such as to grow layers on such topology, improved techniques may be useful that overcome limitations of conventional processing. For example, doping of substrates is often performed by ion implantation in which substrate surfaces that may be effectively exposed to dopant ions are limited by line-of-site trajectories of the ions. Accordingly, vertical surfaces, re-entrant surfaces, or over-hanging surfaces may be inaccessible to such dopant ions. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a processing apparatus may include a plasma chamber configured to generate a plasma; a process chamber adjacent the plasma chamber and configured to house a substrate that defines a substrate plane; an extraction system adjacent the plasma chamber and configured to direct an ion beam from the plasma to the substrate, the ion beam comprising ions that form a non-zero angle with respect to a perpendicular to the substrate plane; and a molecular chamber adjacent the process chamber, isolated from the plasma chamber and configured to deliver a molecular beam to the substrate, wherein the ion beam and molecular beam are alternately delivered to the substrate to form a monolayer comprising species from the ion beam and molecular beam.

In a further embodiment a method may include providing a substrate in a first position, the substrate having a surface that defines a substrate plane and a substrate feature that extends from the substrate plane, the substrate feature having at least one surface that extends at a non-zero angle with respect to the substrate plane; directing an ion beam through an extraction system adjacent the substrate while in the first position, the ion beam comprising angled ions that are incident on the substrate at a non-zero angle with respect to a perpendicular to the substrate plane, the ion beam effective to form a first sub-monolayer comprising a first species on the substrate feature including the at least one surface; and directing a molecular beam to the substrate when the substrate is in a second position when the first sub-monolayer is disposed on the substrate feature, the molecular beam being effective to form a second sub-monolayer of a second species that is configured to react with the first sub-monolayer of the first species to form a monolayer of a product material on the substrate feature including the at least one surface.

BRIEF DESCRIPTION OF THE DRAWINGS

FIG. 1A depicts a side view of a processing apparatus in one mode of operation for delivering ion beams to a substrate according to embodiments of the disclosure;

FIG. 1B depicts the processing apparatus of FIG. 1A in another operation mode for delivering a molecular beam to a substrate;

FIG. 3 depicts an exploded isometric view of a processing apparatus according to embodiments of the disclosure;

DETAILED DESCRIPTION

Figure 1C:
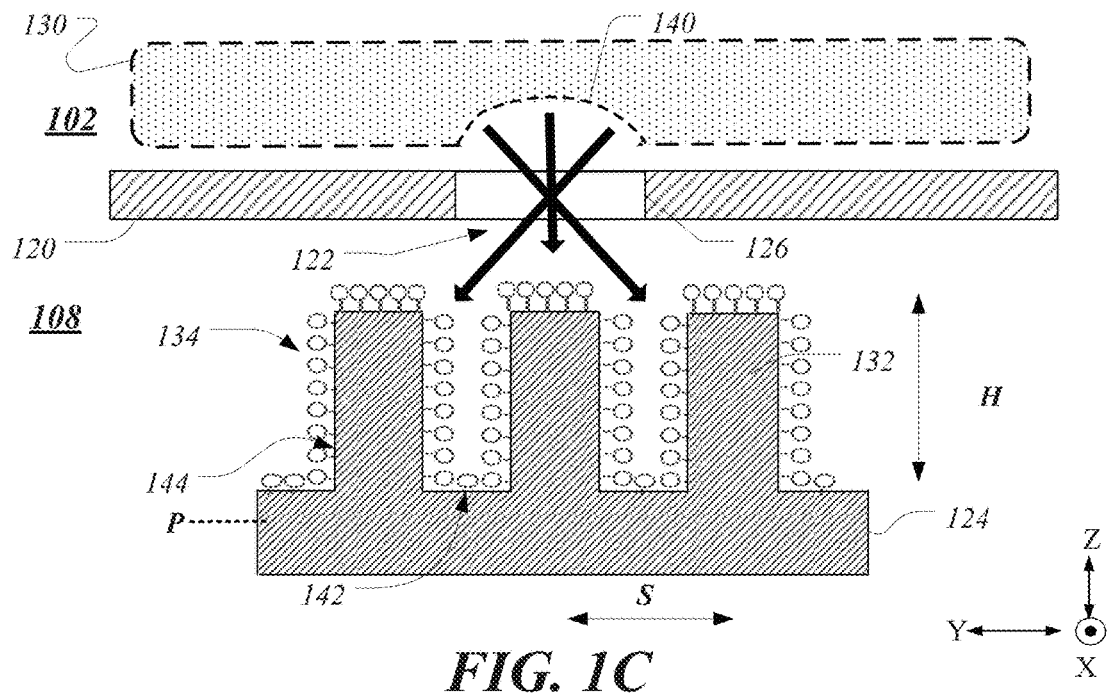
FIG. 1C depicts a close-up of the operation of FIG. 1A.

The present embodiments are related to apparatus and techniques for processing a substrate including forming thin layers on surface features of a substrate. The surface features of the substrate may extend from a substrate plane, and may form such structures as three dimensional lines, fins, pads, pillars, walls, trenches, holes, domes, bridges, cantilevers, other suspended structures, and the like. The embodiments are not limited in this context. Moreover, these features may be collectively or individually referred to herein as a "three dimensional" feature or features. A thin layer that is formed on a substrate feature may be a layer provided for doping, insulation, for encapsulation, or for other purposes.

In various embodiments, novel apparatus and systems are presented that facilitate growth and etching of thin layers on three dimensional features of a substrate. The apparatus of the present embodiments may apply multiple processes to carry out doping of a three dimensional feature. Included among these processes are a modified atomic layer deposition or by modified molecular layer deposition process, which techniques may share characteristics common to conventional atomic layer deposition (ALD) or conventional molecular layer deposition (MLD) except where otherwise noted. The present embodiments provide novel improvements over conventional ALD and MLD that facilitate formation on three dimensional surface features in which surface topography may be severe, such as that described above.

In some embodiments, processes that involve formation of a doping layer using ALD or MLD, may include a series of operations that form multiple layers on substrates that may include three dimensional features. In addition, the formation of each layer may involve multiple operations such as those characteristic of an ALD or MLD process. In one implementation for doping a substrate using a deposited layer formed by ALD or MLD, a surface of the substrate feature may first be cleaned to remove native oxide, which may involve providing a plasma using such species as hydrogen, oxygen, and/or ammonia radicals and molecular hydrides such nitrogen triflouride, arsine, and phosphine.

Secondly, a conformal plasma enhanced atomic layer deposition of dopant oxides may be performed to form a dopant oxide layer on a surface feature. This ALD process may involve deposition of species that include arsenic, boron, phosphorus, arsenic oxide, phosphorus oxide, boron oxides and/or doped silicon oxides such as silicon arsenic oxide, silicon phosphorus oxide, and silicon boron oxides. In particular, these oxides may be deposited using molecular precursors such as arsine, phosphine, and diborane together with plasma-generated atomic beams that contain a reactive gas such as hydrogen, oxygen, nitrogen, and/or ammonia.

In a subsequent operation, a sealing or encapsulating layer such as silicon nitride may be deposited using a combination of a molecular beam containing silane, for example, and another beam containing nitrogen, hydrogen, and/or ammonia. Once the native oxide is removed from a substrate feature to be doped and the dual layer of dopant oxide and sealing nitride is deposited dopants from the dopant oxide layer may be driven into the substrate feature using a known technique such as rapid thermal annealing.

In various embodiments of the disclosure, a layer or plurality of layers may be deposited on a substrate or etched from a substrate using a combination of angled ions and molecular beams, where the molecular beams may comprise undissociated molecules in some implementations. The directing of angled ions may be used in conjunction with other operations to create novel ALD or MLD processes that grow a layer or plurality of layers on a three dimensional substrate feature without the use of a mask. As used herein, unless otherwise noted or qualified by the context, the term "layer" may refer to a sub-monolayer, a monolayer of a material, or may refer to a thin coating or film that has the thickness of many monolayers. Thus, in some instances, a grown "layer" may be composed of a single monolayer that is formed over target portions of a substrate or may be composed of multiple monolayers. Moreover, consistent with various embodiments of the disclosure, a layer that has the thickness of many monolayers may be formed in a monolayer-by-monolayer-by-monolayer fashion as in conventional ALD or MLD processes. However, the present embodiments also cover growth of layers having the thickness of multiple monolayers in which a layer is not grown in a monolayer-by-monolayer fashion.

In various embodiments, novel multichamber apparatus and systems are disclosed that facilitate rapid processing of substrates using a combination of angled ions and molecular beams. These apparatus may in particular minimize cross-contamination between different sources of ions or molecules used to process a substrate.

Formation of a layer comprising a product material by an ALD or MLD process may involve deposition of one monolayer at a time of the product material. Each monolayer of the product material may include two or more different elements that together form a compound material, an alloy, or other multielement material such as silicon oxide, silicon nitride, doped oxides, or other material. The formation of a given monolayer may be accomplished by deposition of a sub-monolayer of a first species or component followed by providing a second sub-monolayer of a second species that reacts with the first sub-monolayer to form a monolayer of the compound. Thus, as used herein the term "sub-monolayer" may denote a layer of a first element that may react with a layer of a second element to form a monolayer of the compound. For example, during deposition of a binary compound such as silicon oxide the layer to be formed is deposited by the repetition of two different half-cycles. After each half-cycle, a fixed amount of reactive species supplied by a first precursor remains on the substrate surface. Ideally, though not necessarily, a single monolayer of a first species may be produced after a first half cycle. In the present context, this single monolayer of a first species of a compound to be formed is referred to as a "sub-monolayer" because the full monolayer of the compound requires the addition of second species to react with the first species. Thus, atoms of the sub-monolayer of first species may be reacted with atoms or molecules of the second species supplied in the next half cycle. In each half-cycle, subsequent to supplying a given species, a purge can be performed to remove any unreacted species of the depositing material. The total amount of material reacted in a cycle may thus be equivalent to a sub-monolayer of each of the first species or second species.

The present embodiments provide novel apparatus that are effective to fabricate layers, films or coatings in a monolayer-by-monolayer fashion, including on three dimensional structures, in a manner that may provide more uniform layer thickness over different surfaces of a three dimensional structure as compared to that achieved by conventional ALD processes.

FIG. 1A depicts a processing apparatus 100 arranged according to various embodiments of the disclosure. The processing apparatus 100 may be employed in particular to grow or etch a layer employed to etch and deposit multiple different materials on a three dimensional structure. As detailed below, this capability may be particularly suitable to perform a novel doping process for doping of a three dimensional structure that may entail deposition of multiple materials as well as etching of at least one layer. In turn, the deposition of each material may entail multiple operations that are performed using a combination of ion beams containing angled ions as well as molecular beams.

As shown in FIG. 1A the processing apparatus 100 may include a plasma chamber 102 that may be used to generate angled ions to be provided to a substrate 124, which is held or supported by the substrate stage 111 as shown. As further shown in FIG. 1A, the processing apparatus 100 includes a process chamber 106 that is adjacent the plasma chamber 102 and in communication with the plasma chamber 102. In operation, the plasma chamber 102 may deliver angled ions to the substrate 124 in the form of an ion beam 122 when the substrate 124 is disposed adjacent the plasma chamber 102. The use of angled ions is discussed in more detail below. However, in brief, the term "angled ions" as used herein refers to an assemblage of ions such as ions in an ion beam, at least some of which are characterized by trajectories that have a non-zero angle of incidence with respect to a perpendicular to a plane P of substrate 124, as illustrated in FIG. 1C. For example, with reference to the Cartesian coordinate system shown, angled ions may have trajectories that form a non-zero angle with respect to the Z-axis.

The processing apparatus 100 also includes a plasma source 114, which may include a power supply and applicator or electrode to generate a plasma according to known techniques. For example, the plasma source 114, in various embodiments, may be an in situ source or remote source, an inductively coupled plasma source, capacitively coupled plasma source, helicon source, microwave source, arc source, or any other type of plasma source. The embodiments are not limited in this context. When gas is supplied by gas source 116 to the plasma chamber 102 the plasma source 114 may ignite a plasma that provides angled ions to the substrate 124 as discussed below. In some embodiments, such as apparatus that uses an inductively coupled source, the angled ions may be formed from molecular species such as oxygen or nitrogen, and may be highly fractionated such that the angled ions are predominantly atomic ions. However, the embodiments are not limited in this context. The processing apparatus also may include a bypass 119 so that gas from the gas source 116 is fed directly to the process chamber 106. This may be used when the substrate 124 is heated by a heater 125 to a higher temperature such as 400-700° C. Under such circumstances gas such as nitrogen, ammonia, or oxygen may react with a substrate without being ionized.

In various embodiments, the gas pressure in a process chamber such as the process chamber 106 may be maintained below 50 mTorr in order to minimize or eliminate gas phase collisions of ions in the ion beam 122 before the ions strike the substrate 124. This allows the angle of ions that are extracted from the plasma chamber to be controlled and maintained so that angle(s) of incidence of ions in an ion beam directed to the substrate 124 may be tailored for a desired result. As discussed in more detail, in various embodiments the substrate 124 may be scanned parallel to Y-axis with respect to the plasma chamber 102 either in a single direction, or back and forth, in order to provide uniform deposition of a layer or etching of a layer over an entire substrate, such as substrate 124.

As further shown in FIG. 1A, the processing apparatus 100 includes a molecular chamber 104. The molecular chamber 104 may transport, for example, molecular gas that is received from a molecular source 118. The molecular chamber 104 may provide the molecular gas to the substrate 124 in the form of a molecular beam 128 for reaction with species such as angled ions provided by the plasma chamber 102. As further illustrated in FIG. 1B, the substrate stage 111 may be movable in a manner that transports the substrate 124 from a first position adjacent the plasma chamber 102 (FIG. 1A) to a second position adjacent the molecular chamber 104.

In some embodiments, and as illustrated in FIG. 1A, a baffle or wall 112 may be provided in the process chamber 106, which may divide the process chamber 106 into a sub-chamber 108 adjacent the plasma chamber 102 and sub-chamber 110 adjacent the molecular chamber 104. The substrate stage 111 may be configured to engage the wall 112 such that the substrate stage 111 and wall 112 isolate sub-chamber 110 from the sub-chamber 108. In some implementations a small gap may remain between the wall 112 and the substrate stage 111. However, the wall 112 may be hollow such that the wall 112 may be differentially pumped by a pump (not shown) to evacuate gas 115 as illustrated. This gas may be either species from the plasma chamber 102 that are present in sub-chamber 108 when the substrate 124 is exposed to the ion beam 122, or species that are present in the sub-chamber 110 when the substrate is exposed to the molecular beam 128. The wall 112 may accordingly prevent unwanted deposition by blocking flow of molecular species such as $SiH_4$, $AsH_3$, and the like, from sub-chamber 110 into sub-chamber 108. The wall 112 may also prevent plasma formed by the plasma chamber 102 from extending into the sub-chamber 110, In one implementation the substrate stage 111 may be movable back and forth between the positions shown in FIGS. 1A and 1B such that the substrate 124 may be exposed multiple times to the ion beam 122 and molecular beam 128. This provides an efficient manner to deposit a monolayer or plurality of monolayers of a desired material on a three dimensional substrate.

Figure 1D:
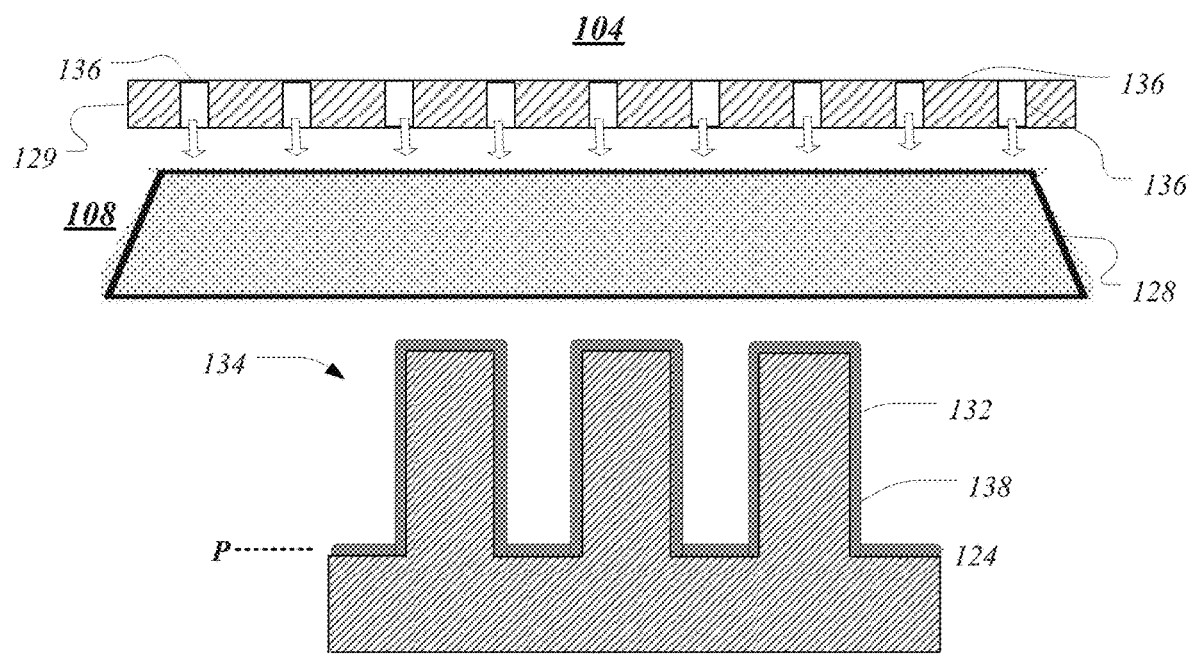
FIG. 1D depicts a close-up of the operation of FIG. 1B.

FIG. 1C depicts a close-up of certain components shown during the operation in FIG. 1A in which an ion beam 122 is directed to the substrate 124, while FIG. 1D depicts a close-up of the operation of FIG. 1B in which the molecular beam 128 is provided to the substrate 124. As shown in FIG. 1B, the processing apparatus 100 includes an extraction plate 120 containing an extraction aperture 126 that provides a path for ions in the plasma chamber 102 to traverse to the sub-chamber 108. In the instance shown in FIG. 1C, a plasma 130 is present in the plasma chamber 102. When a voltage supply 148 (shown in FIG. 1A) provides an extraction voltage between the plasma chamber 102 and substrate stage 111, the ion beam 122 may be extracted from the plasma 130 and accelerated to the substrate 124. In some instances an extraction voltage between 0 and 500 V may be applied to impart energy to ions of the ion beam 122 sufficient to generate surface reactions including attachment of ion species on a substrate surface, but below an energy in which significant sub-surface ion implantation takes place.

As shown in FIG. 1C, the substrate 124 may be provided with three dimensional features such as substrate features 132. Notably, the various components may not be drawn to scale, particularly in the illustration of FIG. 1C. For example, features such as the extraction aperture 126 may have dimensions on the order of millimeters or centimeters, while the substrate features 132 may have dimensions on the order of micrometers or nanometers in some cases. As further shown in FIG. 1C, the extraction aperture 126 may cause the plasma sheath boundary 140 to assume a curved shape adjacent the extraction aperture, which may result in ions of the ion beam 122 exiting the plasma 130 with trajectories that are spread over a range of angles of incidence. The ion beam 122 may in particular include angled ions that are effective to treat the different surfaces of the substrate features 132, including sidewalls of the substrate features 132, which may extend at an angle relative the substrate plane P. Such sidewalls may not be effectively treated by ions that are directed along the perpendicular to the substrate plane P.

It is to be noted that although the ion beam 122 is shown in FIG. 1C as having three trajectories the ion beam may be characterized by an ion angular distribution. The term "ion angular distribution" refers to the mean angle of incidence of ions in an ion beam with respect to a reference direction such as a perpendicular to a substrate, as well as to the width of distribution or range of angles of incidence centered on the mean angle, termed "angular spread" for short. In some examples, the ion angular distribution may be a single mode in which the peak in number of ions as a function of incidence angle is centered on a perpendicular to the plane P. In other examples, the ion angular distribution may involve a mean angle that forms a non-zero angle with respect to a perpendicular to the plane P of the substrate 124.

In particular examples, the ion angular distribution of ion beam 122 may be a bimodal distribution of angles of incidence. For example, the ion beam 122 may have trajectories where the greatest number of trajectories are centered at two angular modes. In various embodiments, by controlling apparatus settings such as plasma power, plasma chamber pressure, and so forth, the separation between peaks of a bimodal distribution may be varied. For example, the peak angles may set at angles between +/−15 degrees with respect to perpendicular to +/−45 degrees with respect to perpendicular in various embodiments, and in one particular embodiment at +/−30 degrees with respect to perpendicular to the plane P. In some implementations a beam blocker (not shown) may be positioned inside a plasma chamber adjacent an extraction aperture, which may have the effect of creating a pair of angled ion beams that may constitute a bimodal distribution of ions.

Referring also to FIGS. 1A and 1B it is further to be noted that the extraction aperture 126 may be elongated in the X-direction to cover an entire substrate, such as substrate 124, in that direction. Accordingly, the ion beam 122 may be directed over the entire substrate to provide uniform ion flux to the substrate by scanning the substrate stage 111, for example, in a continuous manner along the Y-direction while the substrate 124 is adjacent the extraction aperture 126. Moreover, once the substrate 124 is located in the sub-chamber 110 and adjacent the molecular chamber 104, the molecular beam 128 may in some implementations be sufficiently large that the entire substrate 124 may remain stationary and still be exposed to uniform molecular flux.

In some examples, the ion beam 122 may be composed of reactive ions such as atomic oxygen or atomic nitrogen ions. In other examples, the ion beam 122 may be composed molecular oxygen ions or molecular nitrogen ions, or may be composed of mixtures of atomic oxygen ions and molecular oxygen ions, or mixtures or molecular nitrogen ions and atomic nitrogen ions. The embodiments are not limited in this context.

As shown in FIG. 1C the ion beam 122 may be effective to generate a sub-monolayer 134 that covers the three dimensional surfaces of the substrate 124 including the substrate features 132. In various implementations the exact ion angular distribution of the ion beam 122 may be adjusted by adjusting any combination of the aforementioned parameters such as plasma power, gas pressure, extraction voltage, aperture size, or other parameters. This may be useful to tailor the treatment of surfaces such as sidewalls 144, trench bottoms 142, or other parts of a three dimensional feature in order to ensure proper exposure of those surface to ions of the ion beam 122. This may result in deposition of a uniform sub-monolayer, shown as the sub-monolayer 134.

Turning now to FIG. 1D there are shown details of a gas plate 129 that is disposed between the molecular chamber 104 and sub-chamber 110. The gas plate 129 may include multiple apertures 136 that allow gas to stream out of the molecular chamber 104 and form the molecular beam 128. The molecular beam 128 may include molecular species that are effective to react with the sub-monolayer 134 to form a product monolayer, shown as the monolayer 138 as shown. Together, the sequence of operations shown in FIGS. 1B and 1D may constitute a process cycle that is used to form a layer of a material, such as a conformal monolayer of a nitride or a dopant oxide on a three dimensional feature. In implementations for doping of a substrate, for example, this sequence of operations may be repeated a desired number of times to deposit multiple monolayers according to the target level of doping and depth of dopants. However, in some embodiments a single monolayer of dopant oxide may be sufficient to generate a target doping profile in a substrate.

Figure 2A:
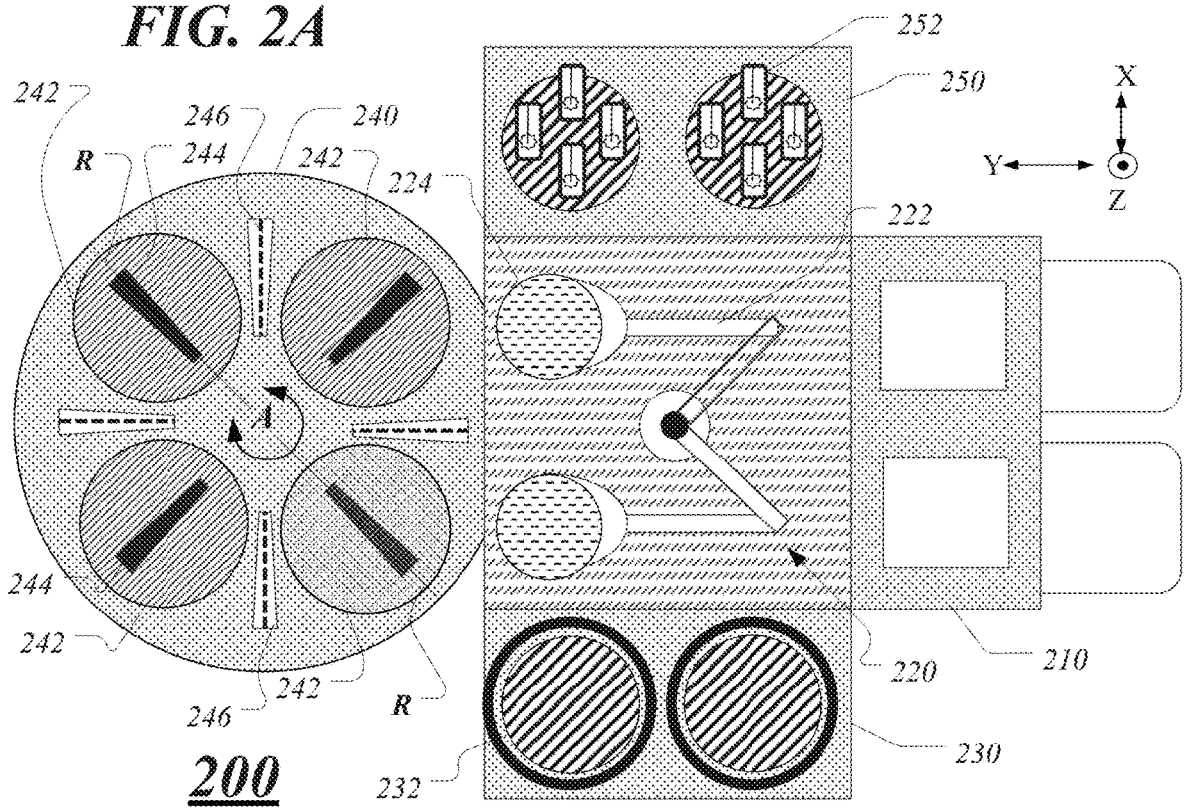
FIG. 2A depicts a top plan view of a processing system according to additional embodiments of the present disclosure.

FIG. 2A depicts a processing system 200 arranged according to further embodiments of the disclosure. The processing system 200 may be employed for high throughput processing of substrates having three dimensional features including ALD or MLD type processes. The processing system 200 includes a load station 210, which may be used to load substrates 224 for processing in various stations or apparatus within the processing system 200, which may take place under vacuum conditions. After loading in the load station 210, the substrates 224 may be transferred by a robot 222 in a transfer chamber 220 to a preclean station 230. The preclean station 230 may include at least one plasma chamber, shown as plasma chamber 232, which may be configured similarly to the plasma chamber 102. In particular, the plasma chamber 232 may direct angled ions such as nitrogen ions to clean surfaces of a substrate 224 including three dimensional features. In the case in which the substrate is a semiconductor material, this may be effective in removing oxide from the surface. In addition, substrates 224 may be heated to drive off other impurities.

The processing system 200 further includes a rotary chamber assembly 240 which may process the substrates 224 through multiple operations. The rotary chamber assembly 240 may perform a combined molecular and atomic beam deposition (MABD) processes that entails exposure to both angled ions from an ion beam and a molecular beam. The angled ions and molecular beam may be provided to a substrate in a manner similarly to that depicted in FIGS. 1A to 1D except as otherwise noted. As illustrated in FIG. 2, the rotary chamber assembly 240 may include a plurality of plasma chambers, shown as plasma chambers 242 that may be disposed around an axis A that lies parallel to the Z-axis as shown. The plasma chambers 242 may be configured to generate the same type of ions as one another or different ions according to alternative implementations.

From the perspective of FIG. 2A, ions that form in the plasma chambers 242 may be extracted through extraction apertures 244 and directed toward substrates that lie below the extraction apertures 244 (into the page). The extraction apertures 244 may be elongated and may additionally be aligned such that their long axes lie along the radii R that extend from the center of the rotary chamber assembly 240. As noted previously, the gas pressure in a chamber or region that houses substrates may be maintained below 50 mTorr to avoid gas phase collisions of ions that are directed through the extraction apertures 244 to a substrate, which allows the ion angular distribution generated by the extraction aperture 244 to be maintained when the ions impact a substrate.

Figure 2B:
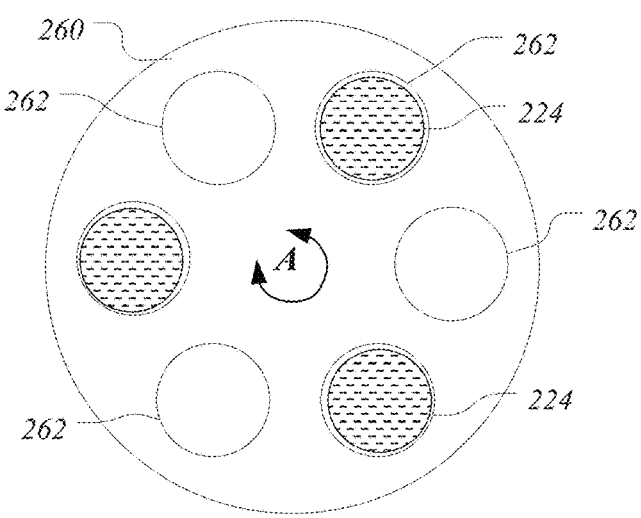
FIG. 2B depicts a top plan view of an exemplary substrate stage that may be implemented in the processing system of FIG. 2A.

FIG. 2B depicts a top plan view of an exemplary substrate stage, shown as substrate stage 260, that may be implemented in the processing system 200 of FIG. 2A. The substrate stage 260 may include a plurality of recesses 262 configured to hold a plurality of substrates 224. As also shown in FIG. 2B, the substrate stage 260 may be configured to rotate around the axis A such that a substrate 224 may be rotatably scanned under an extraction aperture 244. In this manner, an entire substrate may be sequentially exposed to angled ions from a narrow ion beam that is received from a plasma chamber 242, even though the extraction aperture 244 (see FIG. 2A) and ion beam may be much narrower than a diameter of the substrate 224 in the direction perpendicular to R.

As further shown in FIG. 2A, the rotary chamber assembly 240 may include a plurality of injectors or gas apertures 246 that may also extend radially from a center of the rotary chamber assembly. These gas apertures 246 may provide narrow molecular beams to a substrate 224 as the substrate is scanned under a given gas aperture 246. In various embodiments, the molecular beams may include such materials as beam composed of silane ($SiH_4$), arsine ($AsH_3$), phosphine ($PH_3$), or diborane ($B_2H_6$), which are configured to cover a surface of the substrates 224 and react with species provided by the plasma chamber(s) 242.

FIG. 2A additionally illustrates an embodiment in which the gas apertures 246 and extraction apertures 244 are wedge shaped such that a gas aperture 246 or extraction aperture 244 is wider at larger radial distances from a center of the rotary chamber assembly 240. This allows the rotary chamber assembly 240 to deliver a more uniform flux of molecules or angled ions across different portions of a substrate 224 regardless of their radial position when the substrate 224 is rotated under a given extraction aperture 244 or gas aperture 246.

As further depicted in FIG. 2A, the processing system 200 includes an annealing station 250 which may perform annealing of substrates 224 after the substrates 224 are coated with one or more desired layers.

FIG. 3 depicts a variant of a rotary chamber assembly 302 according to various additional embodiments of the disclosure. The rotary chamber assembly 302 includes a source assembly 304 that contains a plurality of different sources. For simplicity, the sources are shown as simple three dimensional wedge shapes. The sources of source assembly 304 may represent at least one plasma chamber and molecular chamber. In some embodiments, a plasma chamber may be disposed adjacent a molecular chamber. For example, source 306 may be a plasma chamber and source 308 may be a molecular chamber, and so forth.

As further shown in FIG. 3, the rotary chamber assembly 302 includes a top plate 310, which may support the source assembly 304, and may include a plurality of apertures 312 that provide communication from a given source to a substrate below. Apertures in the top plate 310 that are coupled to a plasma chamber may be configured to generate angled ions as described above.

As also shown in FIG. 3, the top plate 310 is configured to engage a bottom plate 330. When assembled the top plate 310 and bottom plate 330 may define a process chamber. A rotary substrate stage 320 is provided that is configured to rotate around the Z-axis with respect to the top plate 310 and source assembly 304. The rotary substrate stage 320 may include a plurality of individual substrate holders, shown as the substrate holders 322, which may be used to hold substrates 326. In this manner, when the rotary substrate stage rotates, the substrates 326 may be scanned under plasma chamber(s) and molecular chamber(s) to generate a monolayer-by-monolayer deposition, in one example. The substrate holders 322 may be clamping chucks or electrostatic chucks, and may additionally be equipped with heating capability in some embodiments. For example, the substrate holders 322 may be heated to at least 300° C. in some instances. These substrate holders 322 may be slightly recessed below other portions of the rotary substrate stage 320.

The rotary substrate stage 320 may also be equipped with pumping slots 324, which may be disposed adjacent to substrate holders 322 as shown. The pumping slots 324 may provide a pumping path for pumping apparatus (not shown) to evacuate gas species received at an individual substrate holder 322 to provide isolation between substrates receiving plasma (ion) treatment and those receiving molecular gas exposure. This may be aided by the recessed position of the substrate holders 322. In particular, the entrance of pumping slots 324 may be raised with respect to a plane of the substrate holders 322, which may form a differentially pumped wall that is adjacent a given substrate holder 322.

As noted above, the apparatus of the present embodiments may generate novel deposition techniques that provide improved processing of substrates having three dimensional structures to be processed. Although atomic layer deposition processes have been employed previously, the present embodiments provide advantages over conventional apparatus, which may not be ideally suited for treating substrates having surfaces features that include vertical or reentrant sidewalls, deep trenches, or other severe topology. By maintaining low pressure adjacent a substrate that is below, for example, 50 mTorr, angled ions may be extracted and delivered in a collisionless ion beam to a substrate over a desired angular ion distribution. For applications that entail ALD/MLD to deposit films for doping three dimensional features, various embodiments employ at least one operation that is configured to tailor the angle(s) of incidence of ions provided to a substrate to be coated. This allows a three dimensional substrate feature to be more uniformly coated with a sub-monolayer of a given species using angled ions to provide the given species to the substrate feature.

FIG. 4A to FIG. 4F depict an embodiment of the disclosure that details exemplary operations involved in a method for forming a multi-layer stack on three dimensional features using monolayer-by-monolayer growth.

Figure 4A:
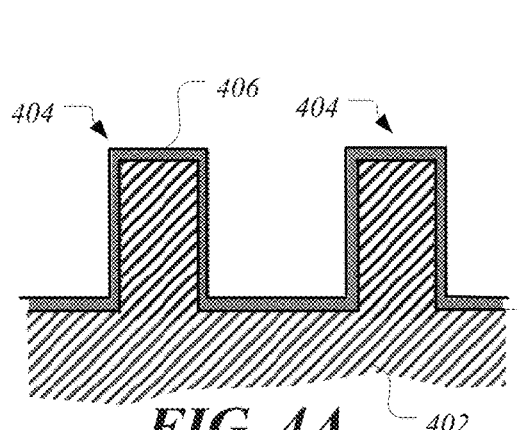
FIG. 4A to FIG. 4F depict an embodiment of the disclosure that details exemplary operations involved in a method for forming a multi-layer stack on three dimensional features using monolayer-by-monolayer growth.

In FIG. 4A there is shown a substrate 402 that includes a plurality of substrate features 404 that extend above a plane P of the substrate 402. In one example, the substrate features 404 may be fins of a finFET device to be fabricated. The substrate features 404 may have a surface layer 406, which may be a native oxide or chemical oxide composed predominantly of silicon oxide, which is to be removed before substrate doping is performed.

Figure 4B:
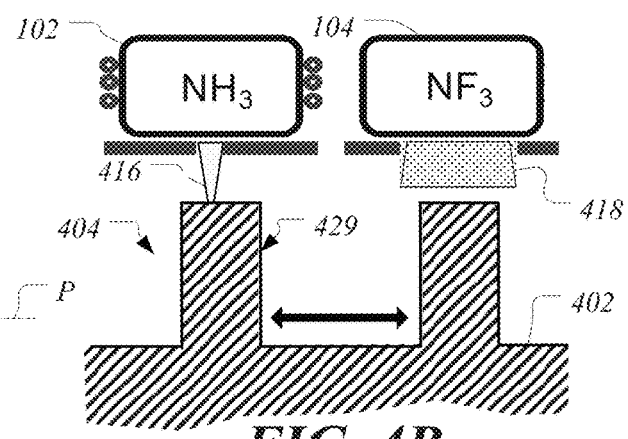

In a subsequent set of operations shown in FIG. 4B, the substrate 402 is treated to remove the surface layer 406. In particular, the substrate 402 may be scanned back and forth to receive alternate exposure from an ion beam 416 that may be extracted from the plasma chamber 102, and a molecular beam 418 that may be provided by the molecular chamber 104. In particular implementations, the ion beam 416 may contain atomic nitrogen and hydrogen ions that are created when from ammonia gas ($NH_3$) is provided to the plasma chamber 102. The molecular beam 418 may comprise a beam of nitrogen triflouride ($NF_3$) which is activated to remove the native oxide layer, surface layer 406, by the presence of a sub-monolayer (not shown) of atomic hydrogen received in the ion beam 416.

Figure 4C:
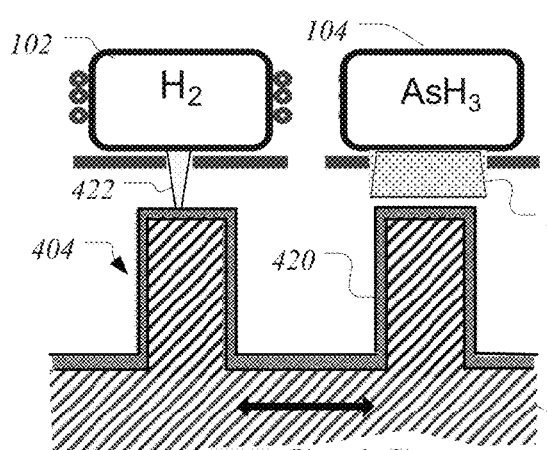

Turning now to FIG. 4C there is shown a further instance in which the substrate 402 is treated to form a dopant layer or dopant oxide layer, shown as layer 420. In particular, the substrate 402 may be scanned back and forth to receive alternate exposure from an ion beam 422 that may be extracted from the plasma chamber 102, and a molecular beam 424 that may be provided by the molecular chamber 104. In a first operation, a hydrogen, ammonia, or nitrogen/hydrogen plasma may be generated in the plasma chamber 102, which is used to form the ion beam 422. In particular, the ion beam 422 supplies atomic hydrogen angled ions to the substrate 402. The substrate 402 is moved back and forth to alternately expose it to the ion beam 422 and molecular beam 424, which may be composed of silane ($SiH_4$), arsine ($AsH_3$), phosphine ($PH_3$), diborane $B_2H_6$, or other molecular gases, depending upon the type of dopant oxide layer to be formed. The molecular gase(s) may be effective to react with the atomic hydrogen to form a monolayer of a given material such as a semiconductor dopant.

In one particular example, the alternate exposures to the ion beam 416 and molecular beam 418 deposit a layer of arsenic material that is formed in a monolayer-by-monolayer fashion, and is highly conformal on the substrate features 404. This may be represented by the layer 420 shown in FIG. 4C. Depending upon whether oxygen is supplied in addition to or instead of hydrogen in the plasma chamber 102 to form the ion beam 416, the layer 420 may be a dopant oxide layer. As noted above, the operations outlined in FIG. 4C may be accelerated and modified by the use of a pulsed DC or continuous substrate bias.

Moreover, by adjusting the gas flows, movement rate of substrate 402, beam angle, gas pressure, substrate temperature, and other parameters, a wide range of composition may be imparted into a doped oxide film represented by the layer 420. The composition of the layer 420 may range, for example, from pure arsenic oxide, to silicon oxide doped with arsenic, to pure silicon oxide. In addition multi-layers and gradients of doped nitrides oxides may be deposited in a similar fashion. Because angled ions may be tailored according to the geometry of the substrate features 404, such dopant layers can be deposited with a high degree of uniformity and control on different surfaces of the substrate features 404.

Figure 4D:
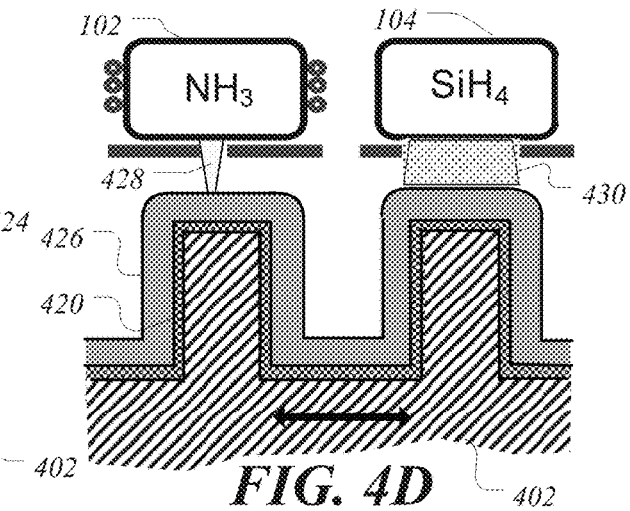
Figure 4E:
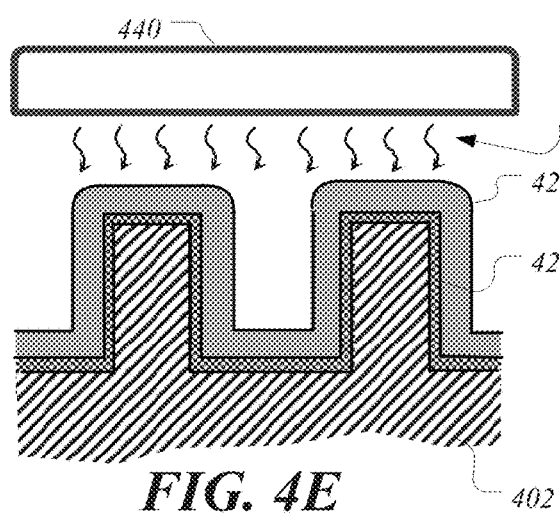
Figure 4F:
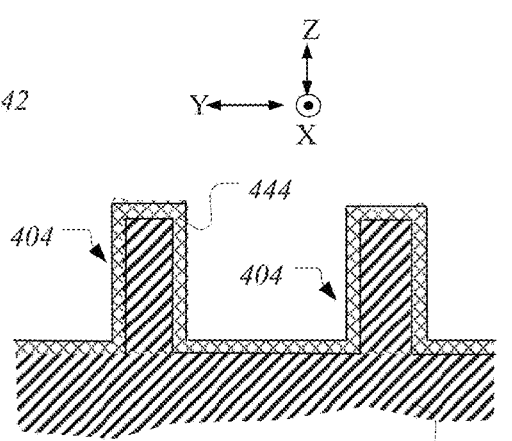

Turning now to FIG. 4D, there is shown a further instance in which the substrate 402 is treated to form a silicon nitride layer that may act as a sealing layer on top of the layer 420. This is shown as the sealing layer 426. This layer may help drive dopants from the layer 420 into the substrate 402. A nitrogen, ammonia, or nitrogen/hydrogen plasma may be created in the plasma chamber 102 to form an ion beam 422 that contains nitrogen ions including atomic nitrogen, which impinges on the substrate 402. Silane or a similar gas may be introduced without plasma power in the molecular chamber 104, to generate a molecular beam 430. The substrate 402 may then be moved back and forth under the atomic nitrogen beam, that is, ion beam 428, and the molecular beam 430 to form the sealing layer 426. In particular, the substrate 402 may be scanned back and forth to receive alternate exposure from the ion beam 428 that may be extracted from the plasma chamber 102, and a molecular beam 430 that may be provided by the molecular chamber 104. As with the formation of a dopant oxide layer in FIG. 4C, the uniformity of the deposition of the sealing layer 426 may be enhanced by adjusting the angle(s) of incidence of the ion beam 428 so as to enhance the deposition rate on the sidewalls 429 (see FIG. 4B).

In a subsequent operation, the substrate 402 may be exposed to a heat source 440 that provides heat 442 to the substrate. The heat source 440 may be a lamp system or other system that is effective to anneal the substrate to a desired temperature. The heat source 440 acts to drive in dopants from the layer 420 into the substrate features 404. Subsequently the layer 420 and the sealing layer 426 may be removed, for example, by known wet chemical processing using HF, buffered oxide etch (BOE), hot phosphoric acid, or other chemistries. This results in a doped three dimensional structure composed of the substrate features 404 in which a three dimensional dopant layer 444 is formed, which may be of uniform thickness on different surfaces of the substrate features 404 as shown.

Figure 5A:
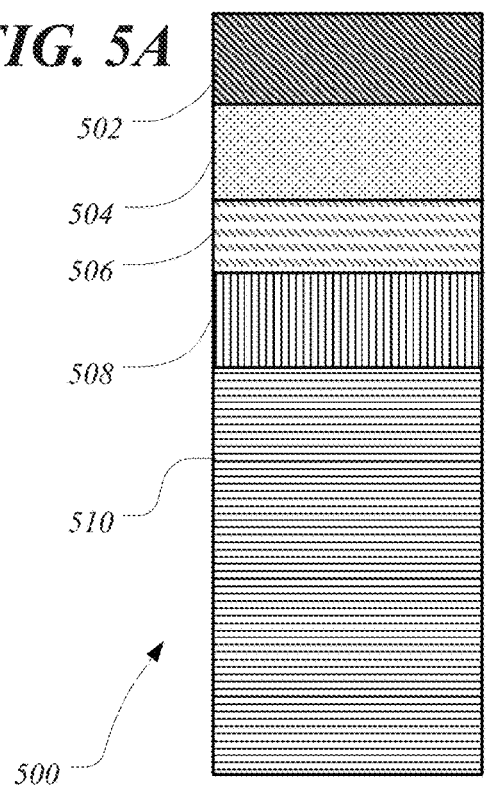
FIG. 5A to FIG. 5D depict details of a method for performing monolayer doping on a three dimensional structure according to embodiments of the disclosure.

FIG. 5A to FIG. 5D depict details of a method for performing monolayer doping on a three dimensional structure according to embodiments of the disclosure. In FIG. 5A there is shown an example of a substrate 500 that includes a layer stack that can be conformally deposited over severe and/or reentrant topology that may be presented by substrate features to be coated. In one example, a base layer 510 may represent a silicon substrate upon which a three dimensional transistor or other structure is to be formed. A layer stack may be formed on the silicon substrate, base layer 510, where the layer stack is composed of a lightly doped p− silicon boron oxide layer 508, an undoped silicon oxide layer 506, a heavily doped n+ silicon arsenic oxide layer 504, and a silicon nitride capping layer 502. Instead of the oxide layers, in other embodiments it is also possible to deposit layers of pure boron, phosphorus, and arsenic.

Figure 5B:
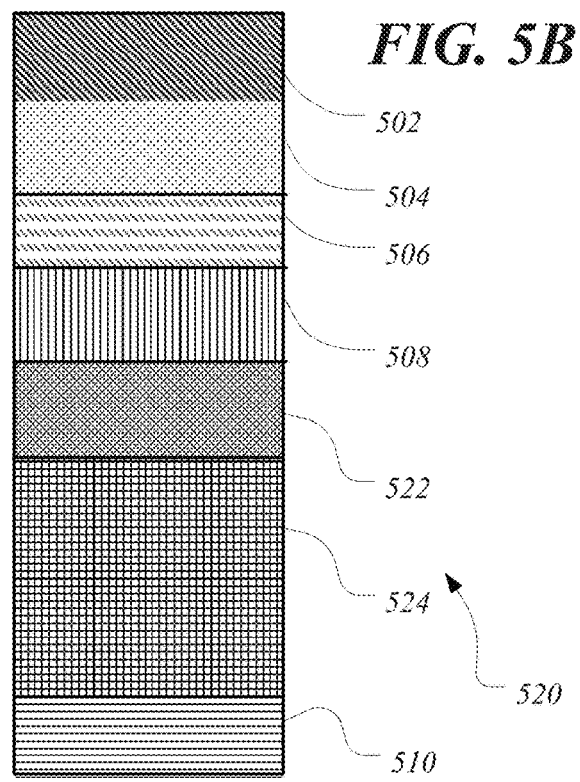
Figure 5C:
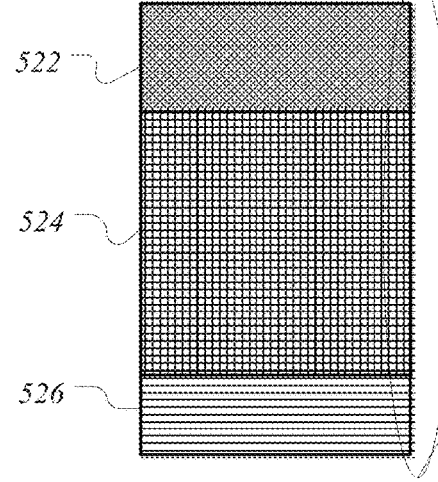
Figure 5D:
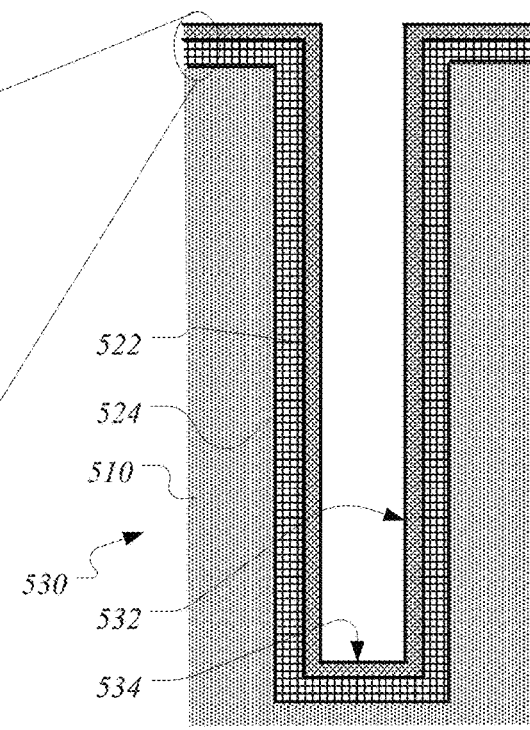

Turning now to FIG. 5B, there is shown the structure of a layer stack 520 formed after a Rapid Thermal Anneal (RTA) process is performed on the substrate 500 of FIG. 5A. An n+ layer 522 is formed with arsenic doping at the top region of the original base layer, base layer 510, and a graded lightly boron doped region, p− layer 524, is created underneath the n+ layer 522. Separation of arsenic from a boron layer may be aided by the slower solid state diffusion rate of arsenic within the base layer 510. In a subsequent operation shown in FIG. 5C, the oxide and nitride layers are removed, such that a n+/p junction is retained in the substrate at the interface of the n+ layer 522 and p− layer 524. This junction can be uniformly created over difficult topology as shown in FIG. 5D, including the sidewalls 532 and trench bottom 534 of the substrate structure 530. This is not possible using other conventional techniques such as conventional ion implantation.

Figure 6:
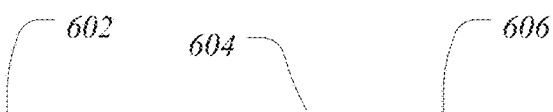
FIG. 6 provides a summary of representative conformal layers, ion beam constituents, and molecular beam constituents consistent with different embodiments of the disclosure.

FIG. 6 provides a summary of representative conformal layers 602, ion beam constituents 604, and molecular beam constituents 606 that may be used to deposit the conformal layers consistent with different embodiments of the disclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method, comprising:
   providing a substrate in a first position, the substrate having a surface that defines a substrate plane and a substrate feature that extends from the substrate plane, the substrate feature having at least one surface that extends at a non-zero angle with respect to the substrate plane, the surface feature comprising a set of sidewalls, a trench and a top surface;
   directing an ion beam through an extraction plate, arranged adjacent the substrate and parallel to the substrate plane, while the substrate is in the first position, the ion beam comprising angled ions that are incident on the substrate at a nonzero peak angle between 15 degrees and 45 degrees with respect to a perpendicular to the substrate plane, the ion beam effective to form a first sub-monolayer comprising a first species on the substrate feature including the at least one surface, wherein the first sub-monolayer is a uniform sub-monolayer that is formed uniformly on the set of sidewalls, the trench and the top surface;

scanning the substrate from the first position, to a second position, along a path that is parallel to the substrate plane; and directing a molecular beam to the substrate when the substrate is in the second position when the first sub-monolayer is disposed on the substrate feature, the molecular beam being effective to form a second sub-monolayer of a second species that is configured to react with the first sub-monolayer of the first species to form a uniform monolayer of a product material on the substrate feature including on the set of sidewalls, the trench and the top surface.

2. The method of claim 1, wherein the substrate is in a first sub-chamber of a process chamber in the first position and the substrate is in a second sub-chamber of the process chamber in the second position that is isolated from the first sub-chamber.

3. The method of claim 1, compromising moving the substrate back and forth to alternately expose the substrate to the ion beam and to the molecular beam, wherein the molecular beam is composed of silane ($SiH_4$), arsine ($AsH_3$), phosphine ($PH_3$), or diborane $B_2H_6$.

4. The method of claim 1, wherein the ion beam is extracted from a plasma chamber, wherein the substrate is disposed in a process chamber, the method further comprising delivering a reactive gas to the plasma chamber, the reactive gas comprising at least one of: oxygen, nitrogen, or nitrous oxide.

5. The method of claim 4, further comprising using a bypass to deliver the reactive gas from a gas source directly to the process chamber without entering the plasma chamber.

6. The method of claim 4, further comprising heating the substrate to at least 300° C. when the reactive gas is delivered directly to the process chamber.

7. The method of claim 2, wherein the substrate is disposed on a rotary substrate stage, and wherein the rotary substrate stage is disposed within the process chamber and configured to move the substrate from the first position to the second position.

8. The method of claim 1, wherein the molecular beam is directed from a molecular chamber, the molecular chamber comprising a set of injectors that define a wedge shape.

9. The method of claim 8, wherein the molecular chamber defines a wedge-shaped chamber.

10. The method of claim 1, wherein the ion beam is extracted from a first plasma chamber and the molecular beam is provided from a first molecular chamber, the method further comprising: delivering to the substrate a second ion species from a second plasma chamber, and delivering to the substrate a second molecular species from a second molecular chamber.

11. The method of claim 1, wherein the ion beam is extracted from a first plasma chamber and the molecular beam is provided from a first molecular chamber, wherein the substrate is disposed in a process chamber, wherein the first plasma chamber, the first molecular chamber and the process chamber are arranged in a rotary chamber assembly, and wherein the substrate is configured to rotate between the first position, wherein the first position is adjacent the first plasma chamber and the second position, wherein the second position is adjacent the first molecular chamber.

12. The method of claim 11, further comprising providing a rotary substrate stage within the process chamber, the rotary substrate stage comprising a plurality of substrate holders and a plurality of pumping slots.

13. The method of claim 11, wherein the ion beam is a first ion beam, wherein the rotary chamber assembly comprises:

a second plasma chamber; and a second molecular chamber, wherein the extraction system is disposed adjacent the first plasma chamber and the second plasma chamber, the extraction system comprising a first extraction aperture that is coupled to the first plasma chamber to direct the first ion beam to the substrate, and a second extraction aperture that is coupled to the second plasma chamber, the method further comprising extracting a second ion beam from the second plasma chamber and directing the second ion beam to the substrate; and directing a second molecular beam to the substrate from the second molecular chamber.

14. The method of claim 1, wherein the ion beam is extracted from a plasma chamber, wherein the extraction plate has an extraction aperture, wherein the extraction aperture is configured to modify a shape of a plasma sheath boundary adjacent the extraction aperture, wherein the angled ions exit the plasma sheath boundary at the non-zero peak angle.

* * * * *